(12) United States Patent
Polepeddi et al.

(10) Patent No.: US 11,218,823 B2
(45) Date of Patent: Jan. 4, 2022

(54) SPEAKER LOAD DIAGNOSTICS

(71) Applicant: TEXAS INSTRUMENTS INCORPORATED, Dallas, TX (US)

(72) Inventors: Aditya Polepeddi, Ahmedabad (IN); Jasjot Singh Chadha, Bengaluru (IN); Mukund Navada Kanyana, Bengaluru (IN); Sahiti Priya C, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/590,590

(22) Filed: Oct. 2, 2019

(65) Prior Publication Data

US 2020/0112808 A1 Apr. 9, 2020

(30) Foreign Application Priority Data

Oct. 8, 2018 (IN) .............................. 201841038047

(51) Int. Cl.
| | |
|---|---|
| *H04R 29/00* | (2006.01) |
| *G01R 31/3193* | (2006.01) |
| *G01R 31/28* | (2006.01) |
| *G01R 31/317* | (2006.01) |
| *G01R 31/319* | (2006.01) |

(52) U.S. Cl.
CPC ....... *H04R 29/001* (2013.01); *G01R 31/2825* (2013.01); *G01R 31/31703* (2013.01); *G01R 31/31922* (2013.01); *G01R 31/31932* (2013.01)

(58) Field of Classification Search
CPC .............. H04R 29/001; G01R 31/2825; G01R 31/31703; G01R 31/31922; G01R 31/31932; G01R 31/2812
See application file for complete search history.

(56) References Cited

U.S. PATENT DOCUMENTS

| 5,440,644 A * | 8/1995 | Farinelli | ............... H04M 1/723 |
| | | | 381/81 |
| 5,473,274 A * | 12/1995 | Reilly | ...................... H03L 7/113 |
| | | | 327/155 |
| 2003/0142833 A1* | 7/2003 | Roy | ........................ H04R 27/00 |
| | | | 381/73.1 |
| 2012/0294450 A1* | 11/2012 | Ozcan | .................... H04R 3/007 |
| | | | 381/59 |

(Continued)

OTHER PUBLICATIONS

Pogliano, Umberto, "Frequency band requirement for a precision RMS measurement system based on successive extraction of the means of absolute values", Oct. 23, 2003, IEEE Transactions on Instrumentation and Measurement, vol. 52, No. 2, pp. 337-340. (Year: 2003).*

*Primary Examiner* — Fan S Tsang
*Assistant Examiner* — Daniel R Sellers
(74) *Attorney, Agent, or Firm* — Ray A. King; Charles A. Brill; Frank D. Cimino

(57) ABSTRACT

A system and method for performing speaker load diagnostics. A digital signal processor generates a diagnostic tone that is provided to the speaker. The diagnostic tone is generated using an oscillator internal to the digital signal processor. The digital signal processor receives current and voltage data from the speaker based on the diagnostic tone, and processes the current and voltage data to determine whether a fault condition exists in the speaker.

18 Claims, 3 Drawing Sheets

(56) References Cited

U.S. PATENT DOCUMENTS

| | | | |
|---|---|---|---|
| 2013/0070933 A1* | 3/2013 | Itou | H04R 3/007 381/59 |
| 2015/0086028 A1* | 3/2015 | Gaiser | H04R 29/001 381/59 |
| 2018/0279044 A1* | 9/2018 | Thormundsson | H03G 3/3005 |

* cited by examiner

SPEAKER LOAD DIAGNOSTICS

CROSS REFERENCE TO RELATED APPLICATION

This application claims priority to Indian Provisional Application No. 201841038047, filed Oct. 8, 2018, the contents of which are incorporated by reference herein.

BACKGROUND

For electrical components such as audio speakers, it may be important to detect faults before using them in an operational mode to prevent damage that can occur during operation if the speaker load or connection to the bad has failed or the speaker is damaged. This may be particularly important in applications where safety is a primary issue, such as with automobile speakers.

For example, if an automobile has been involved in a collision, the speaker may be damaged and using the speaker may cause further damage. Some automobiles, however, may automatically make or receive telephone calls, for example, calls for assistance, which use the audio speaker, when the vehicle is involved in a collision. In these situations, as well as others, it may be important to perform certain diagnostics before activating the audio amplifier to reduce the possibility of further damage.

SUMMARY

Illustrative methods described herein include a method for performing speaker load diagnostics. One such illustrative method includes generating an inaudible diagnostic tone and providing an audio signal to a speaker, the audio signal comprising an audible operational tone and the inaudible diagnostic tone. The method also includes receiving current and voltage data from the speaker based on the audio signal and processing the current and voltage data to determine whether a fault condition exists in the speaker.

Another illustrative method of performing speaker load diagnostics described herein includes using an oscillator in a programmable digital signal processor to generate a clock signal and generating within the digital signal processor a diagnostic tone based on the clock signal. The method also includes providing the diagnostic tone to a speaker and receiving current and voltage data from the speaker based on the diagnostic tone. The method further includes processing the current and voltage data to determine whether a fault condition exists in the speaker.

An illustrative speaker load diagnostic system for determining a fault condition in a speaker described herein includes a digital signal processor. The digital signal processor includes an oscillator configured to provide a clock signal and a tone generator circuit configured to generate a diagnostic tone based on the clock signal. The tone is provided to the speaker. The digital signal processor also includes a load status detection circuit configured to receive current and voltage data from the speaker and process the current and voltage data to determine whether a fault condition exists in the speaker.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Examples of diagnostic systems and methods described herein use existing analog circuitry, and do not add additional analog circuitry, which improves the accuracy of the tests. Examples described herein perform the diagnostics digitally, for example in a digital signal processor (DSP). Examples described herein include a DSP that is self-contained and use an oscillator internal to the DSP to generate a clock signal so as to avoid using an external clock or external data, which may be unreliable particularly where a system-level fault has occurred. Examples described herein may perform the diagnostics in real time or during normal operation, for example when the speaker is playing audio. Alternatively, examples described herein may perform the diagnostics while in a diagnostic mode.

Figure 1:
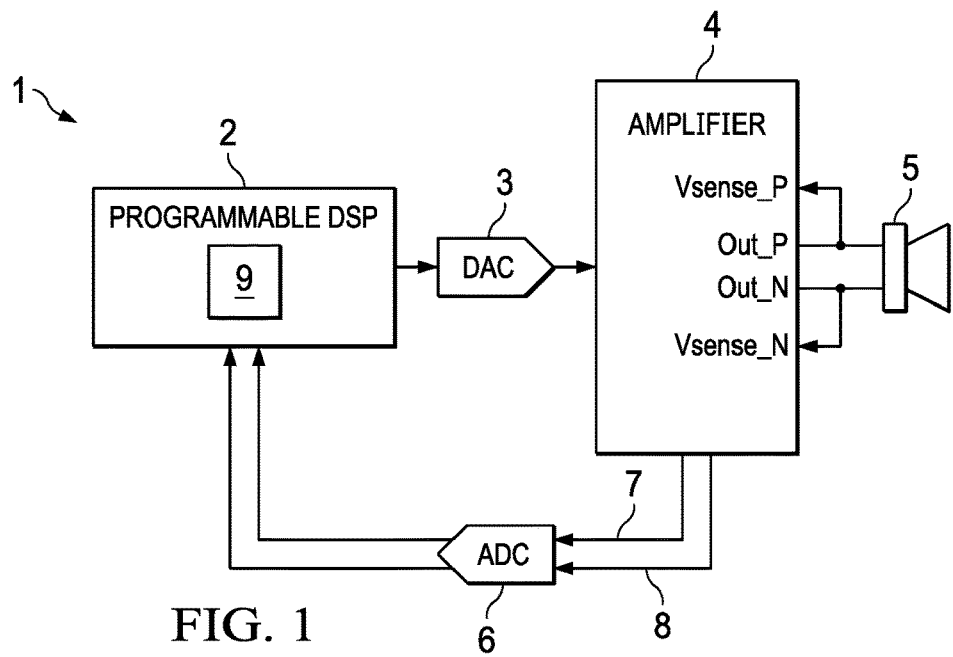
FIG. 1 illustrates an example of a speaker load diagnostic system described herein.

FIG. 1 shows illustrative speaker load diagnostic system 1. System 1 includes audio amplifier 4, which may be, for example, a class D+I/V sense amplifier. Amplifier 4 drives speaker 5 through positive and negative signals Out_P and Out_N, respectively. Positive and negative signals Out_P and Out_N may be fed back into amplifier 4 at Vsense_P and Vsense_N, respectively. Amplifier 4 provides to ADC block 6 current data 7 and voltage data 8 representing the voltage across and the current through the speaker 5, respectively. ADC 6 digitizes the data and provides the digitized data to programmable digital signal processor (DSP) 2 for diagnostic analysis. In examples described herein, programmable DSP 2 uses the digital current and voltage data to determine the existence of a short or open load in speaker 5 by measuring the resistance of speaker 5. Programmable DSP 2 is coupled to amplifier 4 through digital-to-analog converter (DAC) 3 to provide the speaker 5 with a diagnostic tone, as described herein. Programmable DSP 2 may include a memory 9, which may be used as described herein to store parameters and other information needed for the speaker diagnostics.

Figure 2:
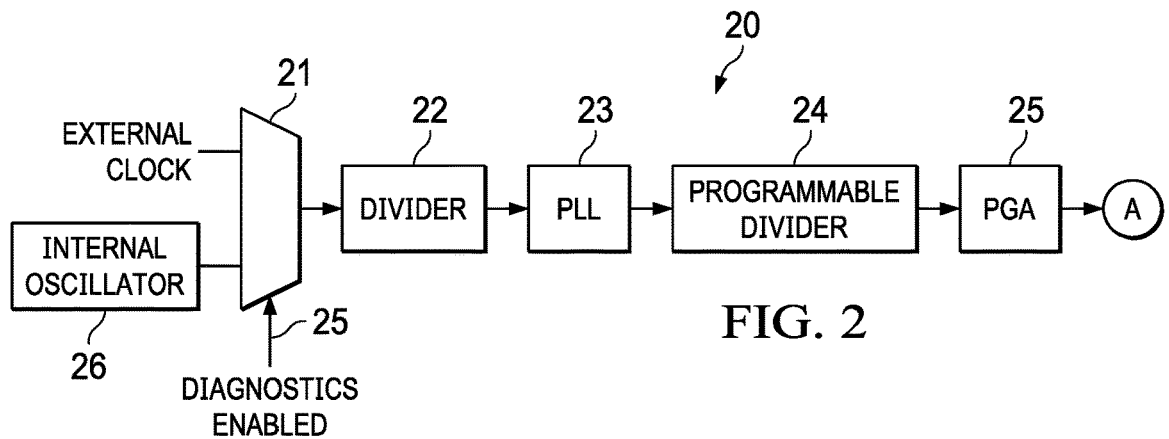
FIG. 2 illustrates an example of a diagnostic tone generation circuit described herein.

FIG. 2 shows an illustrative diagnostic tone generation circuit 20 within programmable DSP 2. Diagnostic tone generation circuit 20 generates the diagnostic tone that is provided to the speaker 5 for the diagnostics described herein. Diagnostic tone generation circuit 20 includes internal oscillator 26, which allows the system 1 to perform diagnostics without the need for an external clock, which may be unreliable if a system-level fault has occurred. Based on, for example, a diagnostics enabled signal 25, multiplexer 21 selectively provides either an internal oscillator clock from internal oscillator 26 or an external clock from a clock external to the programmable DSP 2. The multiplexer 21 may provide the internal oscillator clock during diagnostic modes and may provide the external clock during normal operation. For example, during the illustrative mode described below that involves sending the diagnostic tone to the speaker 5 with an audio signal during normal operation, multiplexer 21 may provide the external audio clock.

Divider 22 receives the clock signal output form multiplexer 21 and generates a reference frequency by dividing its input clock signal to reduce the frequency of the clock signal to a frequency range supported by phase-locked loop (PLL) 23, for example, 1 to 20 MHz. Divider 22 may not be necessary where PLL 23 is capable of receiving the frequency output from multiplexer 21. PLL 23 may be used to increase the frequency to a level higher than that output from the internal oscillator 26, for example to 80 to 90 MHz. The output of PLL 23 is then provided to programmable clock divider 24 which may output signals of multiple frequencies for different uses within the DSP 2, and which allows programming of each output frequency. An output of programmable clock divider 24 is provided to programmable gain amplifier 25, which allows for the gain to be set. Programmable gain amplifier 25 outputs diagnostic tone A having the desired frequency and gain.

The amplitude of diagnostic tone A may be high enough and frequency may be low enough to be inaudible. The diagnostic tone A may be at a higher end of the audible range (e.g., 20 to 22 KHz at −34 dBFs) to enable load diagnostics even in presence of AC coupled speakers. Alternatively, the diagnostic tone A may be at low frequency of 20 Hz-50 Hz, for example if the speaker 5 is DC coupled and/or if high frequencies should be avoided. The diagnostic tone A may run for multiple cycles or sine wave periods (e.g., about 100 ms) and the cycles averaged to reduce noise due to various factors such as transient conditions related to a vehicle power supply.

Figure 3:
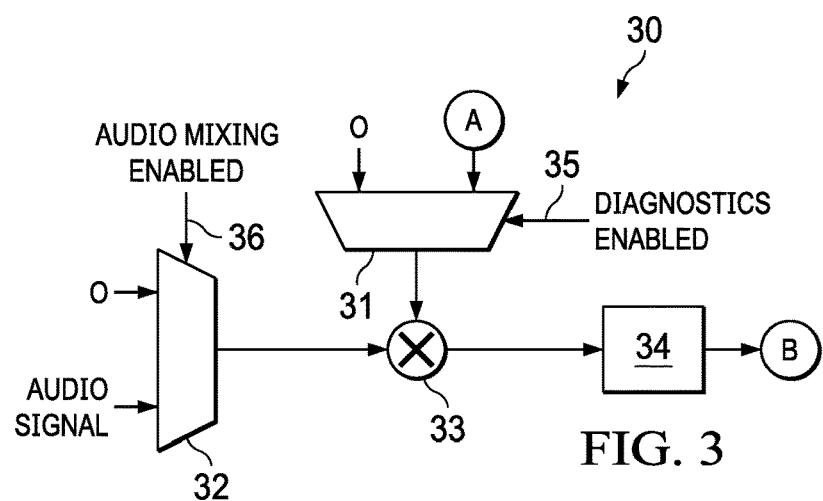
FIG. 3 illustrates an example of a tone combination circuit described herein.

FIG. 3 shows an illustrative tone combination circuit 30 within programmable DSP 2. Tone combination circuit 30 is configured to optionally combine the diagnostic tone A with an audio signal in the example where the diagnostic tone is played on the speaker 5 during normal audio operation. Tone combination circuit 30 may be implemented, for example, in firmware in programmable DSP 2. Tone combination circuit 30 includes multiplexer 31, which receives a diagnostics enabled signal 35 to selectively provide the diagnostic tone A generated by the tone generation circuit in FIG. 2 to mixer 33. If diagnostics is not enabled, multiplexer 31 will instead provide a digital zero value to mixer 33. Tone combination circuit 30 also includes multiplexer 32, which selectively provides, based on audio mixing enabled signal 36, a digital audio signal to mixer 33. If audio mixing is not enabled, multiplexer 32 instead provides a digital zero value to mixer 33. Mixer 33 may be, for example, an ideal mixer.

Mixer 33 combines the signals it receives from multiplexer 31 and multiplexer 32. If diagnostics is enabled and audio mixing is enabled, mixer 33 will combine the diagnostic tone A with the operational audio signal. If diagnostics is enabled but audio mixing is not enabled, mixer 33 will receive the diagnostic tone A from multiplexer 31 and a zero from multiplexer 32, and will therefore combine diagnostic tone A with the zero value (e.g., digital zero), which will result in an output of diagnostic tone A. The output of multiplexer 32 is provided to interpolator 34, which interpolates the signal, for example, 4 times, and outputs a digital audio tone B. Digital audio tone B is provided to digital to analog converter 3 (FIG. 1), which converts the digital audio tone to an analog tone before providing the analog tone to the speaker 5.

Figure 4:
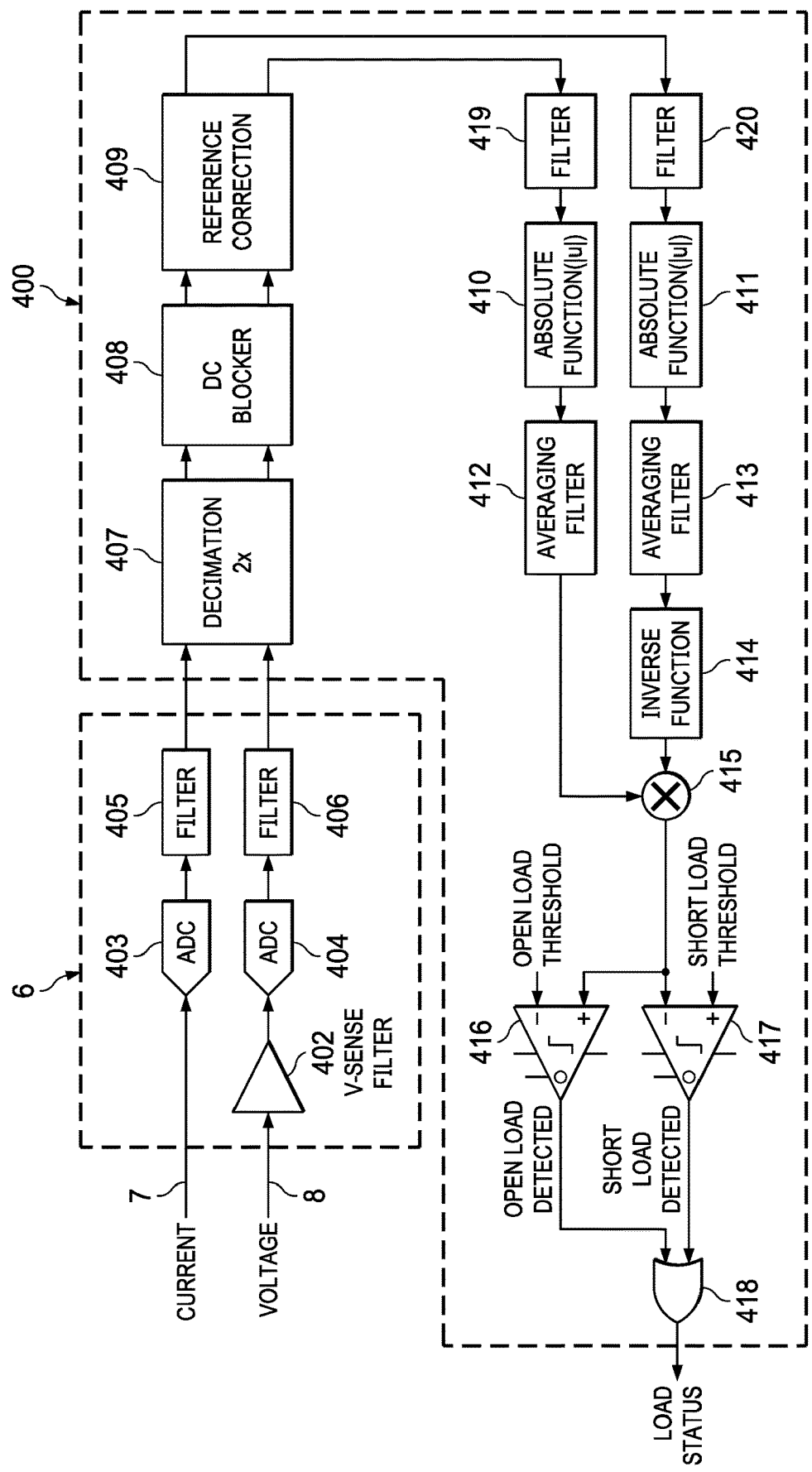
FIG. 4 illustrates an example of an ADC block and an example of a load status detection circuit described herein.

FIG. 4 shows an illustrative circuit diagram of ADC block 6 (FIG. 1) and an illustrative load status detection circuit 400, which may be implemented in programmable DSP 2. ADC block 6 receives the current signal 7 and voltage signal 8 from audio amplifier 4. The voltage signal may first be received at a V-Sense filter 402, which removes switching frequencies. The current and voltage signals are both then sampled in ADCs 403, 404, respectively, which may be ΣΔ (sigma delta) ADCs. The sampled digital signals are then sent to filters 405, 406, respectively, which reduce samples (for example, to 192 ksps). Filters 405, 406 may be, for example, cascaded integrator-comb filters, and may also filter the signal.

The digital signals output from the ADC block 6 are received by the load status detection circuit 400 of programmable DSP 2, first at decimation unit 407, which reduces the sampling frequency by, for example, two times (for example, 192 Ksps may be reduced to 96 Ksps), to reduce power consumption. The decimated current and voltage signals are then sent to DC blocker 408 to remove any direct current from the signal, and then to reference correction block 409 for gain adjustment which corrects errors created by ADCs 403, 404.

As described above, the diagnostic methods described herein may be performed even when the audio device or amplifier is operating in normal mode (e.g., playing audio). In this example, filters 419 and 420 may be used to extract the diagnostic tone. Filters 419, 420 may be band pass filters or low pass filters, depending on the frequency of the diagnostic tone to be extracted. Using filters 419 and 420 to extract the diagnostic tone enables real time speaker resistance calculation when an audio signal is being played at speaker 5. When real time speaker resistance calculation is not enabled and the diagnostic tone is not mixed with an audio signal, filters 419 and 420 are configured to be all-pass filters using coefficients stored in memory 9.

The current and voltage signals from filters 419 and 420 are then sent to absolute function units 410, 411, respectively, before being averaged at averaging filters 412, 413 to obtain an average or root mean square (RMS) for the sensed current and voltage. Averaging filters 412, 413 may be low pass filters or band pass filters. The current signal is then processed at inverse function unit 414 to invert the current signal, and the current and voltage signals are then sent to multiplier 415, which multiplies the averaged voltage signal and the inverse of the averaged current signal to obtain a resistance measurement, which is equivalent to the load resistance of speaker 5.

Comparator 416 receives the calculated resistance from multiplier 415 and compares the calculated resistance to an open load threshold to determine the presence of an open load. Comparator 417 also receives the calculated resistance from multiplier 415 and compares the calculated resistance to a short load threshold to determine the presence of a short load. The outputs from comparators 416, 417 may be input into OR gate 418 to obtain a combined indication of a fault condition (e.g., the existence of a short load or open load). Said another way, the output of the OR gate 418 will indicate whether a short load or open load exists. The open load threshold and short load threshold may be programmable (e.g., by an end user in the memory 9).

Figure 5:
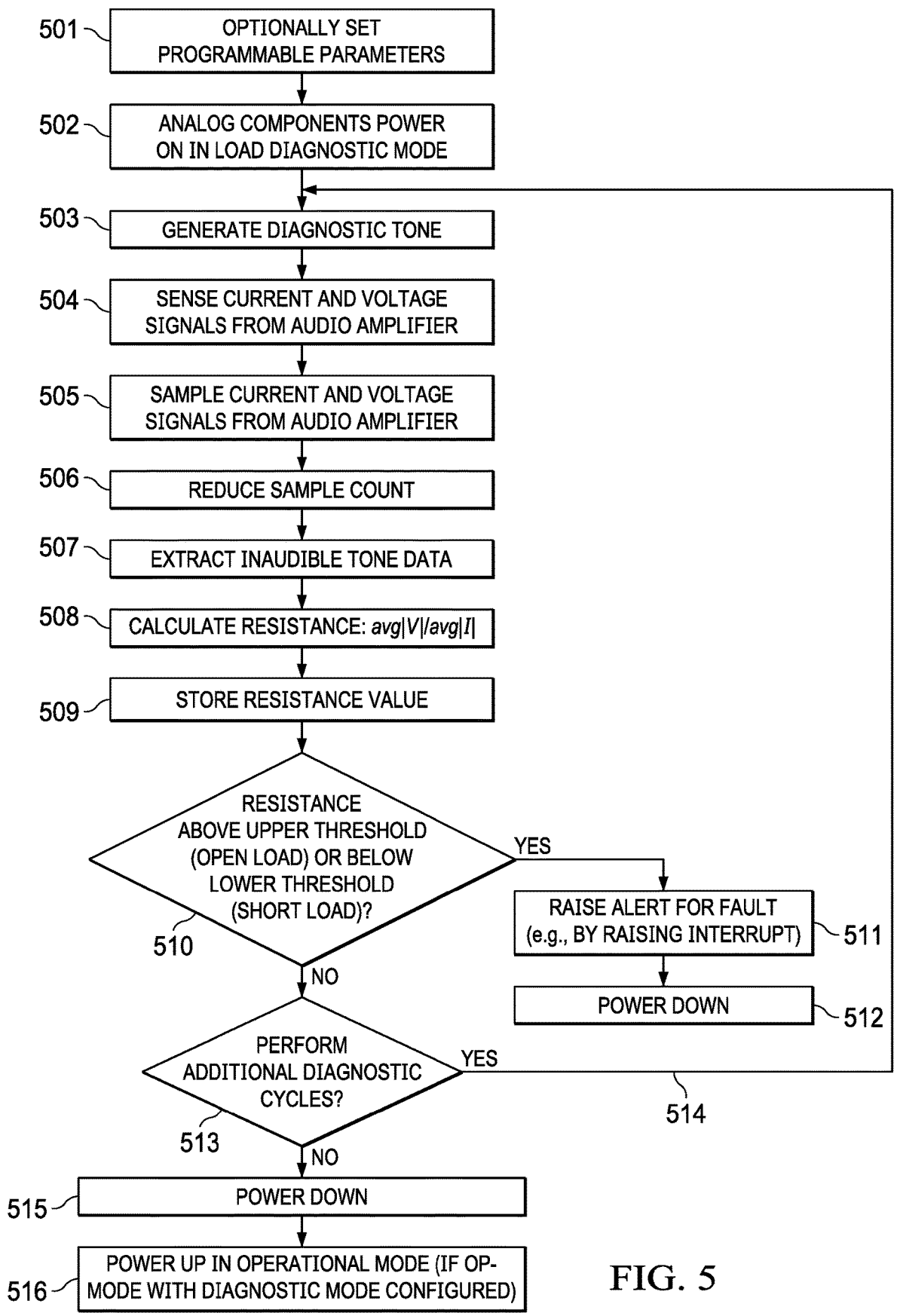
FIG. 5 illustrates an example of a method of performing speaker load diagnostics described herein.

FIG. 5 shows an illustrative method for performing speaker load diagnostics. At step 501, programmable parameters are optionally set for the diagnostics, for example, length, gain, frequency of the tone, number of diagnostic cycles and open and short load thresholds. These parameters may be stored in the memory 9. At step 502, analog components (e.g., audio amplifier 4) are powered on in load diagnostic mode. At step 503, tone generation circuit 30 generates a tone with the set length, gain and frequency. At step 504, ADC block 6 senses current and voltage signals from speaker 5 via audio amplifier 4. At step 505, ADCs 403, 404 sample the current and voltage signals, respectively, to generate digital current and voltage data. At step 506, the number of samples in the digital current and voltage signals is reduced (e.g., by decimation unit 407). At step 507, filters 419 and 420 are used, when the inaudible tone is played is play with an audible tone (e.g., music), to extract the current and voltage data that corresponds At step 508, the equivalent resistance of the speaker is calculated, for example using absolute function units 410, 411, averaging filters 412, 413, inverse function unit 414 and multiplier 415. Absolute function units 410, 411 first generate an absolute value of each voltage and current sample, respectively. The voltage and current samples are then averaged in averaging filters 412 and 413, respectively. The averaged current value is then inverted in inverse function unit 414. The average voltage value and inverted average current value are then multiplied at multiplier 415. The function performed by these units (410-415) is equivalent to:

$$\frac{avg|V|}{avg|I|}$$

At step 509, the calculated resistance may be stored, for example in a pre-defined location in memory 9. At step 510, comparators 416 and 417 determine whether the calculated resistance is above the open load threshold or below the short load threshold, indicating the existence of a fault condition at the speaker. In particular, comparator 416 compares the calculated resistance to an open load threshold to determine if an open load is present at the speaker and comparator 417 compares the calculated resistance to a short load threshold to determine if a short load is present at the speaker. If a short load or open load (i.e., a fault condition) is found, at step 511, an alert is issued, for example by raising an interrupt. The alert may be an audible or visual alert brought to the attention of an end user. At step 512, the device is then powered down.

If no fault is indicated, at step 513 the programmable DSP 2 determines if additional diagnostic cycles are required based on the set number of cycles. If so, at step 514 the programmable DSP returns to step 503. If not, at step 515 the device powers down. At step 516, the device may automatically power back up in operational mode.

Modifications are possible in the described embodiments, and other embodiments are possible, within the scope of the claims.

What is claimed is:

1. A method for performing speaker load diagnostics, the method comprising:
generating, with an internal oscillator, an inaudible diagnostic tone;
providing an audio signal to a speaker input, the audio signal including the inaudible diagnostic tone selectively mixed with either an audible operational tone or a zero value tone;
receiving speaker current and speaker voltage data from the speaker input based on the audio signal;
extracting the diagnostic tone current and diagnostic tone voltage from the speaker current and speaker voltage, respectively;
calculating a root mean square (rms) of absolute values of the diagnostic tone current and the diagnostic tone voltage data; and
processing the rms diagnostic tone current and the rms diagnostic tone voltage data to determine whether a fault condition exists in the speaker.

2. The method of claim 1, wherein the step of receiving speaker current and speaker voltage data comprises:
receiving current and voltage signals from an audio amplifier coupled to the speaker input; and
sampling the current and voltage signals to generate, respectively, the current and voltage data.

3. The method of claim 1, wherein the step of processing the rms current and rms voltage data comprises:
inverting the rms diagnostic tone current to generate an inverted current; and
multiplying the rms diagnostic tone voltage and the inverted current to generate an equivalent resistance of the speaker.

4. The method of claim 3, wherein the step of processing the rms current and rms voltage data further comprises:
comparing the equivalent resistance to an open load threshold and to a short load threshold to determine if an open load or short load is present.

5. The method of claim 4, further comprising:
providing an interrupt if an open load or short load is present.

6. The method of claim 4, further comprising:
powering up in an operational mode if no open load or short load is detected.

7. The method of claim 4, further comprising:
repeating the speaker load diagnostic if no fault is detected.

8. The method of claim 4, further comprising setting at least one selection from the group of a number of diagnostic cycles, a length of the inaudible diagnostic tone, a gain of the diagnostic inaudible tone, a frequency of the inaudible diagnostic tone, the short load threshold and the open load threshold.

9. A method for performing speaker load diagnostics, the method comprising:
using an oscillator in a programmable digital signal processor to generate a clock signal;
generating within the digital signal processor an inaudible diagnostic tone based on the clock signal;
providing an audio signal to a speaker input, the audio signal including the inaudible diagnostic tone selectively mixed with either an audible operational tone or a zero value tone;
receiving current and voltage data from the speaker based on the audio signal;
extracting the diagnostic tone current and diagnostic tone voltage from the speaker current and speaker voltage, respectively;
calculating a root mean square (rms) of absolute values of the diagnostic tone current and the diagnostic tone voltage data; and
processing the rms current and voltage data to determine whether a fault condition exists.

10. The method of claim 9, further comprising:
receiving a frequency input to set a frequency of the inaudible diagnostic tone; and
setting the frequency of the inaudible diagnostic tone based on the frequency input.

11. The method of claim 9, further comprising:
using a programmable divider to provide clock signals having different frequencies for use by the digital signal processor.

12. A speaker load diagnostic system for determining a fault condition comprising:
an oscillator configured to provide a clock signal at an oscillator output;
a tone generator circuit coupled to the oscillator output, and configured to generate an inaudible diagnostic tone based on the clock signal, the tone being provided to a speaker terminal;
a first multiplexer configured to selectively provide the diagnostic tone or a zero value tone to the speaker terminal;
a second multiplexer configured to selectively provide an audible operational tone or a zero value tone to the speaker terminal;
a load status detection circuit configured to receive current and voltage data from the speaker, extract the diagnostic tone current and diagnostic tone voltage from the speaker current and speaker voltage, respectively, average absolute values of the diagnostic tone current and the diagnostic tone voltage data, and process the current and voltage data to determine whether a fault condition exists at the speaker terminal.

13. The system of claim 12, further comprising an analog-to-digital conversion circuit configured to sample current and voltage signals from the speaker terminal to generate the current and voltage data, respectively.

14. The system of claim 13, wherein the analog-to-digital conversion circuit is configured to receive the current and voltage signals from the speaker via an audio amplifier configured to amplify audio signals that are provided to the speaker terminal.

15. The system of claim 13, wherein the load status detection circuit comprises a decimation unit configured to reduce a number of samples in the current and voltage data.

16. The system of claim 12, further comprising a current filter and a voltage filter to extract from the current data and voltage data, respectively, inaudible diagnostic current and voltage data corresponding to an inaudible portion of the tone.

17. The system of claim 12, wherein the load status detection circuit further comprises:
absolute function units configured to take the absolute value of each of the samples of the current and voltage data;
low pass filters configured to find an average voltage of the voltage samples and an average current of the current samples;
an inverter configured to create an inverse current value from the average current;
a multiplier configured to multiply the inverse current value and average voltage to generate an equivalent resistance;
a first comparator configured to determine the existence of an open load by comparing an open load threshold to the equivalent resistance; and
a second comparator configured to test for a short load by comparing a short load threshold to the equivalent resistance.

18. The system of claim 17, wherein the load status detection circuit further comprises an OR gate coupled to outputs of the first comparator and second comparator.

* * * * *